United States Patent [19]

Chan

[11] Patent Number: 5,686,695

[45] Date of Patent: Nov. 11, 1997

[54] RESILIENT PLATE FOR A COMPUTER INTERFACE CARD

[75] Inventor: Louis Chan, Taoyuan, Taiwan

[73] Assignee: Enlight Corporation, Taiwan

[21] Appl. No.: 634,516

[22] Filed: Apr. 18, 1996

Related U.S. Application Data

[63] Continuation-in-part of Ser. No. 616,300, Mar. 15, 1996, abandoned.

[51] Int. Cl.⁶ .................................................... H05K 9/00
[52] U.S. Cl. ..................... 174/35 GC; 361/753; 439/939
[58] Field of Search ..................... 439/92, 108, 61, 439/939; 174/35 R, 35 GC; 361/753, 799, 818, 800, 801, 816

[56] References Cited

U.S. PATENT DOCUMENTS

| | | | |
|---|---|---|---|
| 4,745,524 | 5/1988 | Patton, III | 361/753 |
| 4,901,205 | 2/1990 | Landis et al. | 361/753 |
| 5,311,408 | 5/1994 | Ferchau et al. | 361/753 |
| 5,463,532 | 10/1995 | Petitpierre et al. | 361/753 |
| 5,579,210 | 11/1996 | Ruhland et al. | 174/35 GC |

*Primary Examiner*—Neil Abrams
*Attorney, Agent, or Firm*—Ladas & Parry

[57] ABSTRACT

A resilient plate for a computer interface card which is a plate-like body made of an electrically conductive material includes a body and two side wings formed by bending two opposite ends of the body toward a same direction to a substantially normal position thereto to be retained on the shielding plate of a computer interface card by means of a pair of resilient lugs provided between each of the side wings and the body to be in contact with an inner surface of the interface card expansion slot so as to provide continuity of electrical grounding to isolate and prevent the electromagnetic waves generated by the computer from leaking out thereof.

2 Claims, 2 Drawing Sheets

RESILIENT PLATE FOR A COMPUTER INTERFACE CARD

This application is a continuation-in-part of application Ser. No. 08/616,300 filed on Mar. 15, 1996 now abandoned.

BACKGROUND OF THE INVENTION

The present invention relates to a resilient plate for a computer interface card which can be retained on the shielding plate of an interface card and be in contact with the computer casing to provide an electrically conductive path for the prevention of the electromagnetic radiation generated during the operation of the internal components of the computer from leaking through gaps between the shielding plate and the computer casing.

The so called electromagnetic interference (abbreviated as EMI) is the electromagnetic wave which is generated and radiated outwardly by electromagnetic oscillation in the operation of electronic devices. If the radiation of the electromagnetic wave is subjected to no confinement and thus forming electromagnetic noises, then it may interfere with the receiving operation of other devices that also make use of electromagnetic waves to transmit signals. For example, television sets, radios and wireless communication devices may be interfered with by external electromagnetic waves and causing noisy sounds or poor visual quality. Such a situation more or less has a negative effect on other electronic devices.

Recently, due to the development of the electronic and information industries, computers have been widely used and electromagnetic interference problem caused thereby is getting more and more serious, especially when the computers are operated at higher and higher speeds, the frequency associated therewith is getting higher and higher and thus the problem of EMI is more and more serious. Therefore, most of the countries world-wide have very severe EMI regulations, such as the Federal Communication Commission (FCC) of the United States of America. In view of this situation, EMI should be taken into serious consideration during the design and manufacturing of computers in order to minimize the leakage of EMI.

SUMMARY OF THE INVENTION

The object of the present invention is to provide a resilient plate for a computer interface card which is a plate-like body made of an electrically conductive material and comprises a body and two side wings formed by bending two opposite ends of the body toward a same direction, an opening being provided between each of the side wings and the body, the opening having a first resilient lug provided on the inner edge of the wing side which is slightly inwardly inclined to be retained on the shielding plate of the computer interface card and the opening having a second resilient lug provided on the inner edge of the body side which is slightly outwardly inclined to be in contact with an inner surface of the interface card expansion slot when the computer interface card is mounted in the computer to provide an electrically conductive path with the computer casing in order to prevent the electromagnetic waves from leaking through the gap between the shielding plate and the computer casing.

These and other objects, advantages and features of the present invention will be more fully understood and appreciated by reference to the written specification.

DETAILED DESCRIPTION OF THE INVENTION

Figure 1:
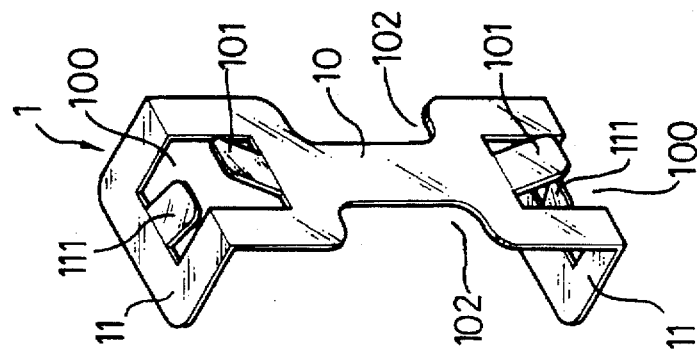
FIG. 1 is an enlarged perspective view of the present invention.

Referring now to FIG. 1, a resilient plate 1 for a computer interface card is in general a plate-like member made of an electrically conductive material, comprising a body 10 and two side wings 11 which are formed by bending two opposite ends of the body 10 toward the same direction to a substantially normal position thereto. An opening 100 is provided between each of the side wings 11 and the body 10 and the opening 100 has, provided on an inner edge thereof located on the side wing 11, a first resilient lug 111 which is slightly inwardly inclined and the opening 100 has, provided on an inner edge thereof located on the body 10, a second resilient lug 101 which is slightly outwardly inclined. Furthermore, if needed, the body 10 may be provided with a notch 102 on each of the lateral edges, substantially at the center thereof, for facilitating installation purposes.

Figure 2:
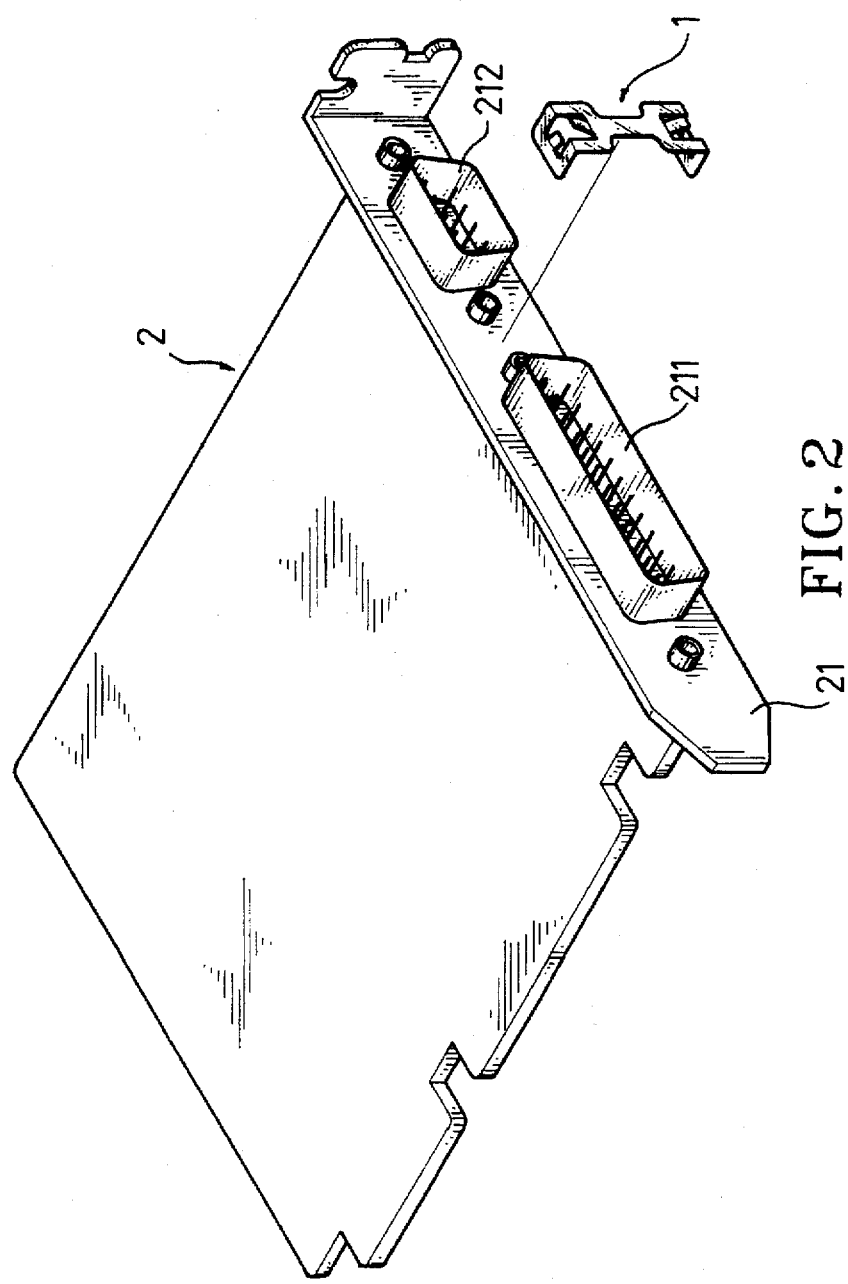
FIG. 2 is an exploded perspective view showing the present invention associated with a computer interface card.
Figure 4:
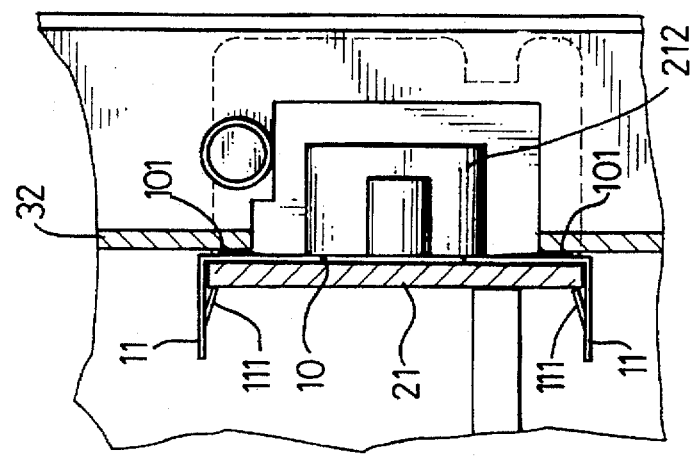
FIG. 4 is an enlarged partial cross-sectional view taken along line 4—4 of FIG. 3.
Figure 3:
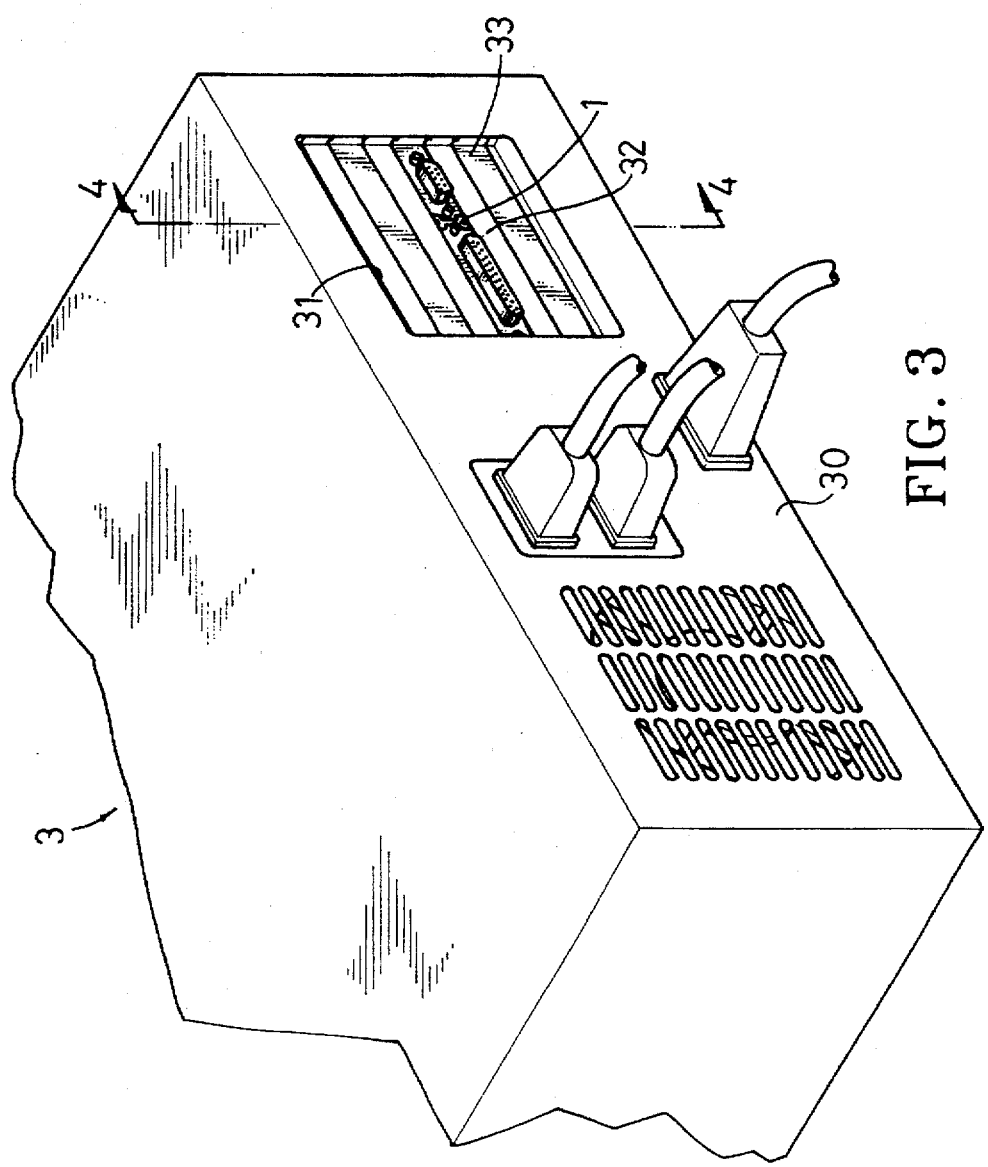
FIG. 3 is a perspective view of a portion computer, showing the present invention mounted on the shielding plate of the computer interface card.

As shown in FIGS. 2 through 4, a computer 3 is generally provided with an expansion slot 31 on a rear panel 30 thereof for the expansion of a computer interface card. Before the interface card expansion is performed, the openings (not designated with reference numeral) that are preserved within the expansion slot are shielded with shielding plates 33 and the preserved openings of the expansion slot are spaced by means of spacing bars 32. In mounting a computer interface card 2, the shielding plate 33 which shields the opening is removed first and a shielding plate 21 of the computer interface card 2 is then inserted and fixed therein. Since the shielding plate is mounted with known means and constitute no feature of the present invention, no further description will be given herein. However, it should be noted that in the assembly of the current computer interface card to the computer, there is no strict requirement of the matching therebetween so that gap exists allowing electromagnetic waves of the computer to leak therethrough and thus causing interference to other electrical devices. Thus, in accordance with the present invention, before mounting the computer interface card 2, the resilient plate 1 is first-fixed on the edges of the shielding plate 21, namely the edges of the shielding plate 21 are interposed between the side wings 11 of the resilient plate 1 with the first resilient lugs 111 tightly touching and clamping against the inner surface of the shielding plate 21. By means of the spring-back force of the first resilient lugs 111, the resilient plate 1 is tightly fixed on the shielding plate 21. Please note that the notches 102 formed on the body 10 of the resilient plate 1 are provided to accommodate the mounting elements (not designated with reference numeral) of the connectors 211 and 212 and can be modified as desired and thus is not absolutely needed. When the computer interface card 2 is mounted in the expansion slot 31 of the computer 3, a force is applied to the second resilient lugs 101 of the body 10 of the resilient plate 1 to form a tight contact point so as to provide continuity of electrical grounding to isolate and prevent the electromagnetic waves generated by the computer from leaking out thereof.

The structure and feature of the present invention, after having been described and illustrated in the above, can be more clearly understood. However, it should be understood that the above described preferred embodiment is only an example for the illustration of the best operation model of the present invention and is not to limit the scope of the present invention. All the modifications and changes that are made without departing from the spirit of the present invention belong to what is claimed to be protected herein.

What is claimed is:

1. A resilient plate for a computer interface card comprising a plate-like body made of an electrically conductive material which includes a body and two side wings formed by bending two opposite ends of the body toward a same direction to a substantially normal position thereto, and an opening being provided between each of the side wings and the body, the opening having a first resilient lug provided on a wing side inner edge thereof which is slightly inwardly inclined, the opening having a second resilient lug provided on a body side inner edge thereof which is slightly outwardly inclined.

2. The resilient plate for a computer interface card as claimed in claim 1, wherein the body has a notch formed on each of lateral edges connecting between the side wings, substantially located at center of the lateral edge.

* * * * *